(12) United States Patent
Nakanishi et al.

(10) Patent No.: US 7,932,114 B2
(45) Date of Patent: Apr. 26, 2011

(54) METHOD OF MANUFACTURING GAN SUBSTRATE, METHOD OF MANUFACTURING EPITAXIALWAFER, METHOD OF MANUFACTURING SEMICONDUCTOR DEVICE AND EPITAXIALWAFER

(75) Inventors: Fumitake Nakanishi, Itami (JP); Yoshiki Miura, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 9 days.

(21) Appl. No.: 12/245,128

(22) Filed: Oct. 3, 2008

(65) Prior Publication Data

US 2009/0093077 A1    Apr. 9, 2009

(30) Foreign Application Priority Data

Oct. 5, 2007  (JP) ................. 2007-262444
Jul. 9, 2008  (JP) ................. 2008-179195

(51) Int. Cl.
*H01L 21/00*    (2006.01)
(52) U.S. Cl. ................. 438/46; 257/E21.001
(58) Field of Classification Search .......... 438/46, 438/481–483, 478; 257/88, 615
See application file for complete search history.

(56) References Cited

U.S. PATENT DOCUMENTS

| 6,177,292 | B1 | 1/2001 | Hong et al. |
| 2004/0051105 | A1* | 3/2004 | Tsuda et al. ........... 257/79 |
| 2007/0215901 | A1 | 9/2007 | Shibata |
| 2009/0256240 | A1* | 10/2009 | Hashimoto et al. ........... 257/615 |

FOREIGN PATENT DOCUMENTS

| EP | 1821339 A1 | 8/2007 |
| JP | 7-165498 | 6/1995 |
| JP | 11-1399 | 1/1999 |

OTHER PUBLICATIONS

Kensaku Motoki et al., "Preparation of Large GaN Substrates", Materials Science and Engineering, 2002, pp. 123-130, vol. B93.
Shuji Nakamura et al., "Continuous-wave Operation of InGaN/GaN/AlGaN-Based Laser Diodes Grown on GaN Substrates", Applied Physics Letters, Apr. 20, 1998, pp. 2014-2016, vol. 72, No. 16.
Christiansen, S.H., et al. "Relaxation Processes of AlGaN/GaN Heterostructures Grown onto Single Crystal GaN (0001) Substrates," 3rd International Conference on Nitride Semiconductors, Jul. 4-9, 1999, Montpellier, France, vol. 176, No. 1, Jul. 4, 1999, pp. 285-290.

* cited by examiner

*Primary Examiner* — N Drew Richards
*Assistant Examiner* — Mamadou Diallo
(74) *Attorney, Agent, or Firm* — Drinker Biddle & Reath LLP

(57) ABSTRACT

Assuming that r (m) represents the radius of a GaN substrate, t1 (m) represents the thickness of the GaN substrate, h1 (m) represents a warp of the GaN substrate before formation of an epitaxialwafer, t2 (m) represents the thickness of an $Al_xGa_{(1-x)}N$ layer, h2 (m) represents a warp of the epitaxialwafer, a1 represents the lattice constant of GaN and a2 represents the lattice constant of AlN, the value t1 found by the following expression is decided as the minimum thickness (t1) of the GaN substrate:

$(1.5 \times 10^{11} \times t1^3 + 1.2 \times 10^{11} \times t2^3) \times \{1/(1.5 \times 10^{11} \times t1) + 1/(1.2 \times 10^{11} \times t2)\}/\{15.96 \times x \times (1-a2/a1)\} \times (t1+t2) + (t1 \times t2)/\{5.32 \times x \times (1-a2/a1)\} - (r^2+h^2)/2h = 0$ A GaN substrate having a thickness of at least this minimum thickness (t1) and less than 400 μm is formed.

4 Claims, 5 Drawing Sheets

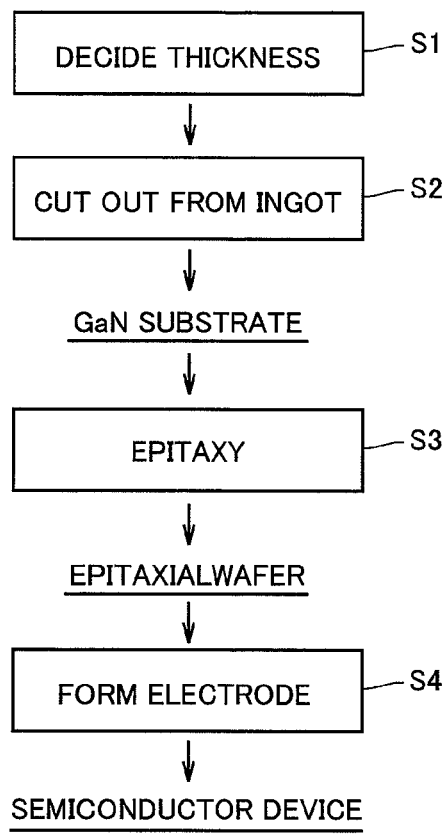
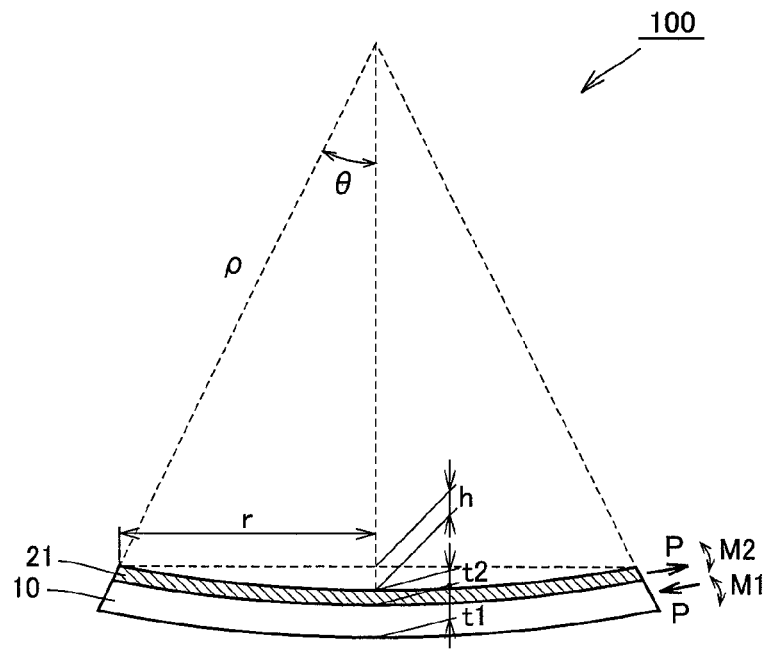

METHOD OF MANUFACTURING GAN SUBSTRATE, METHOD OF MANUFACTURING EPITAXIALWAFER, METHOD OF MANUFACTURING SEMICONDUCTOR DEVICE AND EPITAXIALWAFER

BACKGROUND OF THE INVENTION

1. Field of the Invention

The present invention relates to a method of manufacturing a GaN substrate, a method of manufacturing an epitaxialwafer, a method of manufacturing a semiconductor device and an epitaxialwafer, and more particularly, it relates to a method of manufacturing a GaN substrate having a c-plane for manufacturing an epitaxialwafer by successively stacking at least two layers including an $Al_xGa_{(1-x)}N$ layer and a GaN layer on the c-plane, a method of manufacturing an epitaxialwafer, a method of manufacturing a semiconductor device and an epitaxialwafer.

2. Description of the Background Art

In general, a GaN (gallium nitride) substrate is employed as the substrate for a semiconductor device such as a light-emitting diode (LED) or a laser diode (LD). When GaN having an energy band gap of 3.4 eV and high thermal conductivity is applied to the substrate for the semiconductor device, an electrode can be provided on the back surface of the GaN substrate, and the driving (operating) voltage of the semiconductor device can be reduced.

Such a GaN substrate is manufactured by a method described in K. Motoki et al., "Preparation of Large GaN Substrates", Materials Science and Engineering B93 (2002), pp. 123-125, for example. This document discloses that the GaN substrate is manufactured through the following steps: First, a buffer layer of GaN having a thickness of 60 μm is formed on a GaAs (gallium arsenide) substrate by HVPE (Hydride Vapor Phase Epitaxy). Thereafter a GaN layer having a thickness of 500 μm is formed on the buffer layer by HVPE. Thereafter the GaAs substrate is removed, and a GaN substrate having a thickness of 495±10 μm is obtained by polishing.

According to the aforementioned document, however, no plurality of GaN substrates are cut out from a bulk GaN single crystal in the thickness direction, and hence a high cost is disadvantageously required for obtaining the GaN substrate.

In order to reduce the cost for each GaN substrate, a technique of manufacturing a GaN substrate by manufacturing an ingot of GaN having a large thickness and cutting out a plurality of GaN substrates from this ingot in the thickness direction is conceivable. If the GaN substrate cut out from the ingot has a thickness of 495±10 μm as described in the aforementioned document, however, this thickness may be excessive, depending on the performance of a warp required to the semiconductor device formed on this GaN substrate. In this case, the cost cannot be sufficiently reduced.

While the GaN substrate is preferably cut out from the ingot with a smaller thickness in order to further reduce the cost, the GaN substrate having a small thickness may be cracked when subjected to working such as polishing. Even if the GaN substrate remains uncracked, an epitaxialwafer comprising the GaN substrate and epitaxial layers may be remarkably warped when the epitaxial layers are formed on the GaN substrate. In this case, photolithography or the like cannot be performed in order to form an electrode on this epitaxialwafer, and the epitaxialwafer cannot be applied to a semiconductor device.

SUMMARY OF THE INVENTION

Accordingly, an object of the present invention is to provide a method of manufacturing a GaN substrate allowing formation of an epitaxialwafer with a warp of not more than a required level and enabling reduction of the cost, a method of manufacturing an epitaxialwafer, a method of manufacturing a semiconductor device and an epitaxialwafer.

The method of manufacturing a GaN substrate according to the present invention is a method of manufacturing a GaN substrate having a c-plane for manufacturing an epitaxialwafer by successively stacking at least two layers including an $Al_xGa_{(1-x)}N$ layer having an Al composition x of over zero and not more than 0.3 and a thickness of over zero and not more than 30 nm and a GaN layer on the c-plane through the following steps: Assuming that t1 (m) represents the thickness of the GaN substrate, r (m) represents the radius of the GaN substrate, t2 represents the thickness of the $Al_xGa_{(1-x)}N$ layer, x represents the Al composition in the $Al_xGa_{(1-x)}N$ layer, h(m) represents a warp of the epitaxialwafer, a1 represents the lattice constant of GaN and a2 represents the lattice constant of AlN, the value t1 found by the following expression 1 is decided as the minimum thickness of the GaN substrate:

$$(1.5 \times 10^{11} \times t1^3 + 1.2 \times 10^{11} \times t2^3) \times \{1/(1.5 \times 10^{11} \times t1) + 1/(1.2 \times 10^{11} \times t2)\}/\{15.96 \times x \times (1-a2/a1)\} \times (t1+t2) + (t1 \times t2)/\{5.32 \times x \times (1-a2/a1)\} - (r^2 + h^2)/2h = 0 \quad \text{(expression 1)}$$

Then, a GaN substrate having a thickness of at least this minimum thickness and less than 400 μm is cut out from an ingot of GaN.

The inventors have deeply studied a method of deciding the thickness of the GaN substrate employed for the epitaxialwafer having the aforementioned structure, to find the above expression 1. In other words, the minimum thickness for satisfying the set warp h of the epitaxialwafer can be decided by the above expression 1, and hence the number of GaN substrates obtained in the thickness direction can be increased by cutting out each GaN substrate from one ingot with the thickness of at least the decided minimum thickness and less than 400 μm. Therefore, a GaN substrate capable of reducing the warp of the formed epitaxialwafer to not more than the required level and attaining reduction of the cost can be manufactured.

In a case of manufacturing a GaN substrate employed for an epitaxialwafer comprising a plurality of $Al_xGa_{(1-x)}N$ layers, t2 represents the total thickness of the plurality of $Al_xGa_{(1-x)}N$ layers. In this case, further, x represents the Al composition ratio in the $Al_xGa_{(1-x)}N$ layer most occupying the total thickness t2. The Al composition x is expressed in a molar ratio.

Preferably in the aforementioned method of manufacturing a GaN substrate, a GaN substrate having a thickness, at least the minimum thickness, of at least 100 μm and less than 250 μm is formed in the aforementioned step of cutting out the GaN substrate.

When the minimum thickness is less than 100 μm, the thickness of the GaN substrate is so set to at least 100 μm that the GaN substrate is easy to handle and the number of the GaN substrate manufacturable from one ingot in the thickness direction can be increased. When the minimum thickness is less than 100 μm, further, the thickness of the GaN substrate is so set to less than 250 μm that the more easily handleable GaN substrate can be manufactured.

In a method of manufacturing an epitaxialwafer according to an aspect of the present invention, the following steps are carried out: First, the aforementioned GaN substrate is manufactured by the aforementioned method of manufacturing a GaN substrate. An $Al_xGa_{(1-x)}N$ layer is formed on the c-plane of this GaN substrate. A GaN layer is formed on this $Al_xGa_{(1-x)}N$ layer.

According to the method of manufacturing an epitaxialwafer according to this aspect of the present invention, an epitaxialwafer having a warp of not more than h and comprising a GaN substrate having a small thickness can be manufactured, even if the $Al_xGa_{(1-x)}N$ layer and the GaN layer are formed on the GaN substrate. Therefore, the manufactured epitaxialwafer can be applied to a semiconductor device, and the epitaxialwafer can be manufactured at a cost reduced due to the reduction of the cost for manufacturing the GaN substrate.

In a method of manufacturing an epitaxialwafer according to another aspect of the present invention, the following steps are carried out: First, the aforementioned GaN substrate is manufactured by the aforementioned method of manufacturing a GaN substrate. A GaN layer is formed on the c-plane of this GaN substrate. An $Al_xGa_{(1-x)}N$ layer is formed on this GaN layer. Another GaN layer is formed on this $Al_xGa_{(1-x)}N$ layer.

According to the method of manufacturing an epitaxialwafer according to this aspect of the present invention, an epitaxialwafer having a warp of not more than h and comprising a GaN substrate having a small thickness can be manufactured even if the GaN layer, the $Al_xGa_{(1-x)}N$ layer and the GaN layer are formed on the GaN substrate in this order. Therefore, the manufactured epitaxialwafer can be applied to a semiconductor device, and the epitaxialwafer can be manufactured at a cost reduced due to the reduction of the cost for manufacturing the GaN substrate.

In the method of manufacturing a semiconductor device according to the present invention, the following steps are carried out: First, an epitaxialwafer is manufactured by the aforementioned method of manufacturing an epitaxialwafer. Then, an electrode is formed on the epitaxialwafer.

According to the method of manufacturing a semiconductor device according to the present invention, an epitaxialwafer having a warp of not more than h and comprising a GaN substrate having a small thickness can be manufactured even if the electrode is formed on the epitaxialwafer. Therefore, the semiconductor device can be manufactured at a cost reduced due to the reduction of the cost for manufacturing the GaN substrate.

The epitaxialwafer according to the present invention comprises a GaN substrate, an $Al_xGa_{(1-x)}N$ layer formed on the c-plane of the GaN substrate and a GaN layer formed on the $Al_xGa_{(1-x)}N$ layer. The thickness of the GaN substrate is less than 250 μm. A warp of the epitaxialwafer is not more than 100 μm.

According to the epitaxialwafer according to the present invention, the thickness of the GaN substrate can be reduced to the conventionally unattainable level of less than 250 μm through the above expression 1, and the warp of the epitaxialwafer can be reduced to not more than 100 μm.

According to the method of manufacturing a GaN substrate, the method of manufacturing an epitaxialwafer, the method of manufacturing a semiconductor device and the epitaxialwafer according to the present invention, the warp of the formed epitaxialwafer is reduced to not more than the required level, and the cost for the GaN substrate can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a flow chart showing a method of manufacturing the semiconductor device according to the second embodiment;

FIG. 6 is a schematic sectional view showing an epitaxialwafer consisting of a GaN substrate and an $Al_xGa_{(1-x)}N$ layer formed on the GaN substrate;

DESCRIPTION OF THE PREFERRED EMBODIMENTS

Figure 1:
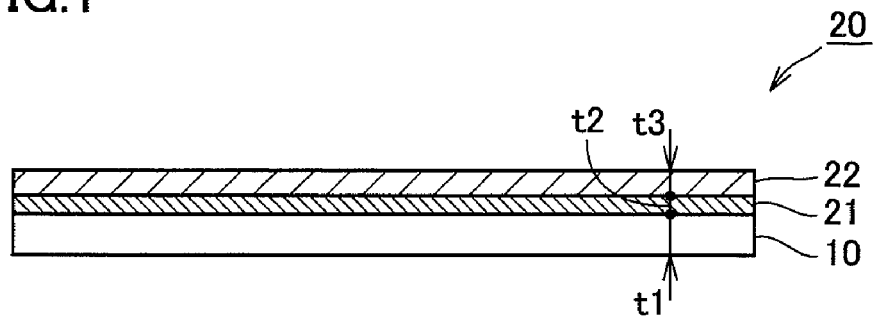
FIG. 1 is a schematic sectional view showing an epitaxialwafer according to a first embodiment of the present invention.

Embodiments of the present invention are now described with reference to the drawings. In the accompanying drawings, portions identical or corresponding to each other are denoted by the same reference numerals, and redundant description is not repeated.

First Embodiment

FIG. 1 is a schematic sectional view showing an epitaxialwafer 20 according to a first embodiment of the present invention. As shown in FIG. 1, epitaxialwafer 20 comprises a GaN substrate 10, an $Al_xGa_{(1-x)}N$ layer 21 and a GaN layer 22. GaN substrate 10 has a c-plane. $Al_xGa_{(1-x)}N$ layer 21 is formed on the c-plane of GaN substrate 10. GaN layer 22 is formed on $Al_xGa_{(1-x)}N$ layer 21.

The thickness t1 of GaN substrate 10 is less than 250 μm, and a warp of epitaxialwafer 20 is not more than 100 μm. More preferably, the thickness t1 of GaN substrate 10 is at least 100 μm and less than 250 μm, and the warp of epitaxialwafer 20 is at least 2 μm and not more than 85 μm. Particularly preferably, the thickness t1 of GaN substrate 10 is at least 120 μm and not more than 240 μm, and the warp of epitaxialwafer 20 is at least 2 μm and not more than 50 μm. When the thickness t1 of GaN substrate 10 and the warp of epitaxialwafer 20 are in these ranges respectively, the performance of a warp necessary for an LED is satisfied, and the thickness t1 of GaN substrate 10 is small. When the warp of epitaxialwafer 20 is 12 μm, the maximum thickness t1 of GaN substrate 10 calculated from the above expression 1 is 250 μm. When the warp of epitaxialwafer 20 is 50 μm, on the other hand, the maximum thickness t1 of GaN substrate 10 calculated from the above expression 1 is 120 μm. In other words, the thickness t1 of GaN substrate 10 and the warp of epitaxialwafer 20 satisfy the relation of not more than the warp h of epitaxialwafer 20 set in the above expression 1.

If GaN substrate 10 is warped, the thickness t1 corresponds to that of GaN substrate 10 in virtual lines extended from lines along side surfaces including both ends of an arbitrary radius of GaN substrate 10.

The Al composition x in $Al_xGa_{(1-x)}N$ layer 21, not particularly restricted so far as the same is over zero and not more than 0.30, is preferably at least 0.05 and not more than 0.30, more preferably at least 0.18 and not more than 0.30. In this case, epitaxialwafer 20 is suitably applied to a semiconductor device.

The thickness t2 of $Al_xGa_{(1-x)}N$ layer 21, not particularly restricted so far as the same is over zero and not more than 30 nm, is preferably at least 10 nm and not more than 30 nm, more preferably at least 20 nm and not more than 30 nm. In this case, epitaxialwafer 20 is suitably applied to a semiconductor device.

If epitaxialwafer 20 is warped, the thickness t2 of $Al_xGa_{(1-x)}N$ layer 21 corresponds to that of epitaxialwafer 20 in virtual lines extended from lines along side surfaces including both ends of an arbitrary radius of epitaxialwafer 20.

A plurality of $Al_xGa_{(1-x)}N$ layers 21 may be provided, and GaN layer may be provided between $Al_xGa_{(1-x)}N$ layers 21. If a plurality of $Al_xGa_{(1-x)}N$ layers 21 are provided, the total thickness thereof is regarded as the thickness t2 of $Al_xGa_{(1-x)}N$ layers 21. If a plurality of $Al_xGa_{(1-x)}N$ layers 21 are provided, further, the Al composition in $Al_xGa_{(1-x)}N$ layer 21 most occupying the thickness t2 is regarded as the Al composition x.

The thickness t3 of GaN layer 22 is smaller than the thickness t1 of GaN substrate 10. A plurality of GaN layers 22 may be provided, and another $Al_xGa_{(1-x)}N$ layer may further be provided between GaN layers.

The radius r (see FIG. 7) of GaN substrate 10 is preferably at least 25 nm. If the radius r is at least 25 nm, a mass production process can be carried out at a proper cost.

Figure 2:
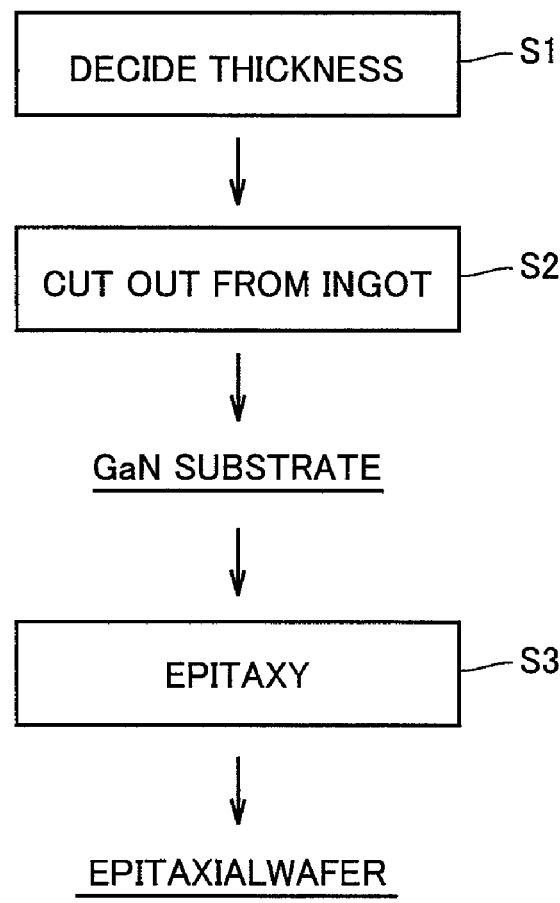
FIG. 2 is a flow chart showing a method of manufacturing the epitaxialwafer according to the first embodiment of the present invention.

A method of manufacturing epitaxialwafer 20 according to this embodiment is described with reference to FIGS. 1 and 2. FIG. 2 is a flow chart showing the method of manufacturing epitaxialwafer 20 according to this embodiment.

Assuming that t1(m) represents the thickness of GaN substrate 10, r (m) represents the radius of GaN substrate 10, t2(m) represents the thickness of $Al_xGa_{(1-x)}N$ layer 21, h (m) represents the warp of epitaxialwafer 20, a1 (m) represents the lattice constant of GaN and a2 m) represents the lattice constant of AlN, the value t1 found by the following expression 1 is decided as the minimum thickness of GaN substrate 10, as shown in FIG. 2 (step S1):

$$(1.5\times10^{11}\times t1^3+1.2\times10^{11}\times t2^3)\times\{1/(1.5\times10^{11}\times t1)+1/(1.2\times10^{11}\times t2)\}/\{15.96\times x\times(1-a2/a1)\}\times(t1+t2)+(t1\times t2)/\{5.32\times x\times(1-a2/a1)\}-(r^2+h^2)/2h=0 \quad \text{(expression 1)}$$

The aforementioned "lattice constant a1 of GaN" and "lattice constant a2 of AlN" denote those in a direction perpendicular to c-axes. GaN and AlN are hexagonal compounds. Hexagonal compounds have lattice constants a1 and a2 in the direction perpendicular to the c-axes and lattice constants c1 and c2 in the c-axis direction. As to GaN, the lattice constant a1 in the direction perpendicular to the c-axis is $3.19\times10^{-10}$ m(3.19 Å), and the lattice constant c1 in the c-axis direction is $5.19\times10^{-10}$ m(5.19 Å). As to AlN, the lattice constant a2 in the direction perpendicular to the c-axis is $3.11\times10^{-10}$ m(3.11 Å), and the lattice constant c2 in the c-axis direction is $4.98\times10^{-10}$ m(4.98 Å).

More specifically, the radius r of GaN substrate 10 is first obtained. This radius r may be obtained by preparing an ingot of GaN and measuring the length of a portion of this ingot for forming the radius r of GaN substrate 10. If the ingot includes an underlayer substrate and a layer of GaN formed on this underlayer substrate, the radius r may be obtained as the radius of the underlayer substrate, for example.

Then, the thickness t2 of manufactured epitaxialwafer 20, the warp h. (see FIG. 7) of epitaxialwafer 20 and the composition x of Al constituting $Al_xGa_{(1-x)}N$ layer 21 are set. The warp h of epitaxialwafer 20 is set to a value allowing photolithography with a stepper or an aligner, for example. The lattice constants a1 and a2 of GaN and AlN are known values, as described above. The values r, t2, h, x, a1 and a2 are substituted in the expression 1, thereby finding the thickness t1 of GaN substrate 10. This thickness t1 is regarded as the minimum thickness.

If a plurality of $Al_xGa_{(1-x)}N$ layers 21 are provided, the total thickness thereof is regarded as the thickness t2 of $Al_xGa_{(1-x)}N$ layers 21. If a plurality of $Al_xGa_{(1-x)}N$ layers 21 are provided, further, the Al composition in $Al_xGa_{(1-x)}N$ layer 21 most occupying the thickness t2 is regarded as the Al composition x.

Then, GaN substrate 10 having a thickness of at least the minimum thickness and less than 400 μm is cut out from the ingot of GaN (step S2).

More specifically, the thickness of GaN substrate 10 cut out from the prepared ingot is decided. Thereafter GaN substrates 10 are cut out from the ingot by slicing or the like, so that each GaN substrate 10 has this thickness. The method of cutting out GaN substrate 10 is not particularly restricted, but a well-known method can be employed.

GaN substrate 10 cut out from the ingot preferably has a thickness of at least the minimum thickness decided in the above expression 1 and less than 400 μm, more preferably at least the minimum thickness, and at least 100 μm and less than 250 μm. When cut out from the ingot with the minimum thickness decided in the above expression 1, GaN substrate 10 can be employed for epitaxialwafer 20 having the set warp h. If GaN substrate 10 having this minimum thickness is hard to handle, GaN substrate 10 is preferably cut out from the ingot with a thickness exceeding the minimum thickness and allowing handling. Particularly when having a thickness of at least 100 μm, cut-out GaN substrate 10 is easy to handle. When having a thickness of less than 400 μm, cut-out GaN substrate 10 is extremely easy to handle. When GaN substrate 10 has a thickness of less than 250 μm, the number of cut-out GaN substrates 10 can be increased, and each GaN substrate 10 is easy to handle.

GaN substrate 10 can be manufactured by carrying out the aforementioned steps. GaN substrate 10 manufactured in this manner may further be subjected to polishing or the like. In order to manufacture epitaxialwafer 20 shown in FIG. 1, the following step is further carried out:

$Al_xGa_{(1-x)}N$ layer 21 is formed on the c-plane of GaN substrate 10, and GaN layer 22 is formed on $Al_xGa_{(1-x)}N$ layer 21 (step S3). In this step 3, $Al_xGa_{(1-x)}N$ layer 21 and GaN layer 22 are formed by epitaxy. This epitaxy is not particularly restricted, but vapor phase growth such as sublimation, HVPE, MBE (Molecular Beam Epitaxy) or MOCVD (Metal Organic Chemical Vapor Deposition) or liquid phase growth can be employed, for example.

In the step S3, $Al_xGa_{(1-x)}N$ layer 21 is so formed that the Al composition x is over zero and not more than 0.3 and the thickness is over zero and not more than 30 nm. The above expression 1 is set on the assumption that the warp h is maximized when the Al composition x and the thickness t1 of GaN substrate 10 are in these ranges respectively. When the Al composition x and the thickness t1 of GaN substrate 10 are in these ranges respectively, therefore, the set warp h of epitaxialwafer 20 is satisfied, and the thickness t1 of GaN substrate 10 for satisfying the warp h of epitaxialwafer 20 is not excessively increased. Therefore, the above expression 1 can be applied to epitaxialwafer 20 including GaN substrate 10 having the Al composition x and the thickness t1 in the aforementioned ranges.

When a plurality of $Al_xGa_{(1-x)}N$ layers 21 are provided, $Al_xGa_{(1-x)}N$ layers 21 are so formed that the total thickness thereof regarded as the thickness t2 is over zero and not more than 30 nm and the Al composition x in $Al_xGa_{(1-x)}N$ layer 21 most occupying the thickness t2 is over zero and not more than 0.3.

Epitaxialwafer 20 shown in FIG. 1 is manufactured by carrying out the aforementioned steps. After epitaxialwafer 20 is manufactured, the surface of GaN substrate 10 opposite to that provided with $Al_xGa_{(1-x)}N$ layer 21 may further be subjected to polishing or the like. Epitaxialwafer 20 manufactured in this manner satisfies the warp h set before the manufacturing, and GaN substrate 10 has the minimum thickness in the range allowing handling. Thus, the cost for manufacturing GaN substrate 10 is reduced, whereby the cost for manufacturing epitaxialwafer 20 can also be reduced.

Second Embodiment

Figure 3:
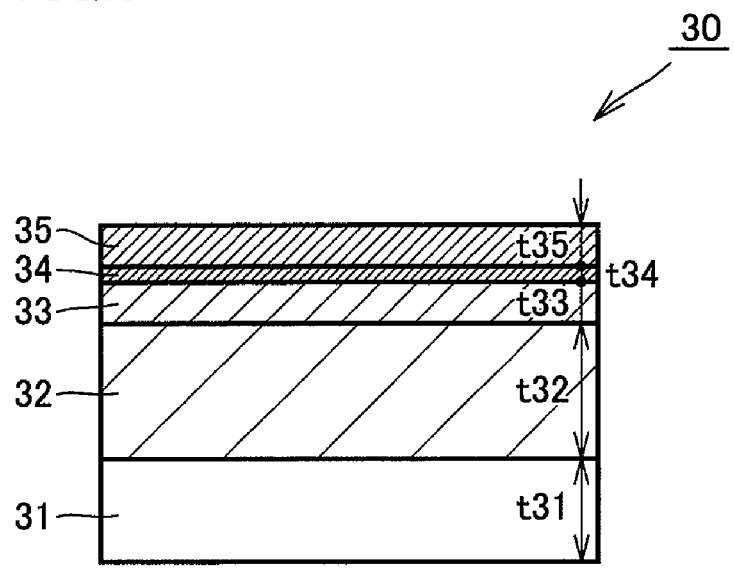
FIG. 3 is a schematic sectional view showing an epitaxialwafer according to a second embodiment of the present invention.

FIG. 3 is a schematic sectional view showing an epitaxialwafer 30 according to a second embodiment of the present invention. As shown in FIG. 3, epitaxialwafer 30 according to this embodiment comprises a GaN substrate 31, a buffer layer 32, an active layer 33, an electron blocking layer 34 and a contact layer 35.

Figure 4:
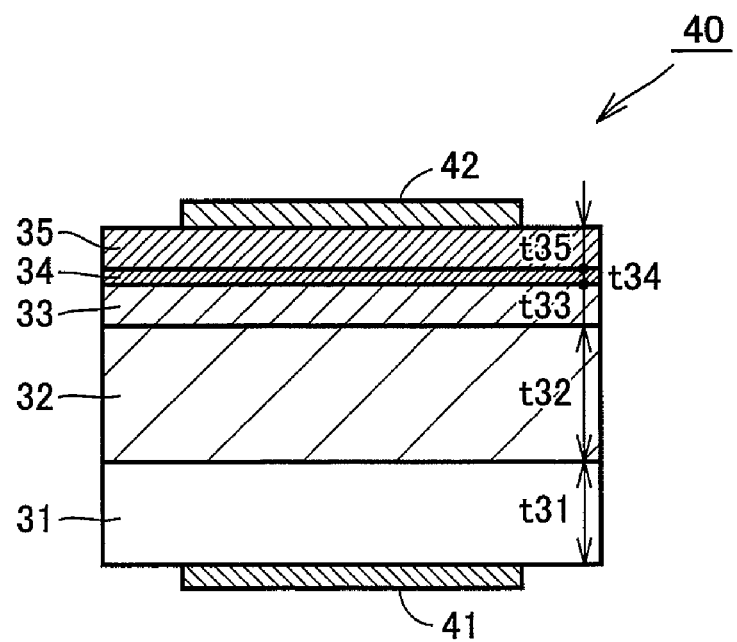
FIG. 4 is a schematic sectional view showing a semiconductor device according to the second embodiment of the present invention.

FIG. 4 is a schematic sectional view showing an LED 40 as a semiconductor device according to the second embodiment of the present invention. LED 40 serving as the semiconductor device according to the second embodiment comprises epitaxialwafer 30 shown in FIG. 3 and electrodes 41 and 42.

In epitaxialwafer 30 and LED 40, GaN substrate 31 has a thickness t31. Buffer layer 32 is formed on the c-plane of GaN substrate 31. Buffer layer 32 is made of n-type GaN, for example, and has a thickness t32. Active layer 33 is formed on buffer layer 32. Active layer 33 has a thickness t33. Active layer 33 is constituted of a multiple quantum well structure consisting of InGaN and GaN, for example. Active layer 33 may alternatively consist of a single semiconductor material. Electron blocking layer 34 is formed on active layer 33. Electron blocking layer 34 is made of p-type $Al_xGa_{(1-x)}N$ for example, and has a thickness t34. Contact layer 35 is formed on electron blocking layer 34. Contact layer 35 is made of p-type GaN, for example, and has a thickness t35.

In LED 40, electrode 41 is formed on the surface of GaN substrate 31 opposite to that provided with buffer layer 32. Electrode 41 is made of titanium and aluminum, for example. Electrode 42 is formed on contact layer 35. Electrode 42 is made of nickel and gold, for example.

Methods of manufacturing GaN substrate 31, epitaxialwafer 30 and LED 40 according to this embodiment are now described with reference to FIGS. 3 to 5. FIG. 5 is a flow chart showing the method of manufacturing the semiconductor device according to this embodiment.

First, the minimum thickness of GaN substrate 31 is decided through the above expression 1 (step S1). In order to decide the minimum thickness, the thickness t2 and the Al composition x of the $Al_xGa_{(1-x)}N$ layer and the warp h of epitaxialwafer 30 in the expression 1 are set.

According to this embodiment, GaN substrate 31 is employed for epitaxialwafer 30 shown in FIG. 3, and hence the thickness t2 of the $Al_xGa_{(1-x)}N$ layer in the expression 1 corresponds to the thickness t34 of electron blocking layer 34. If active layer 33 includes an $Al_xGa_{(1-x)}N$ layer, the $Al_xGa_{(1-x)}N$ layer included in active layer 33 is extremely thin, and hence the sum of the thickness of the $Al_xGa_{(1-x)}N$ layer included in active layer 33 and the thickness t34 of electron blocking layer 34 is substantially equal to the thickness t34 of electron blocking layer 34.

Further, the Al composition x of the $Al_xGa_{(1-x)}N$ layer in the expression 1 corresponds to the Al composition x of electron blocking layer 34. Also when active layer 33 includes the $Al_xGa_{(1-x)}N$ layer, electron blocking layer 34 most occupies the total thickness t2 of the $Al_xGa_{(1-x)}N$ layers, and hence the Al composition x of the $Al_xGa_{(1-x)}N$ layer in the expression 1 corresponds to the Al composition x of electron blocking layer 34.

Then, the warp h required to manufactured epitaxialwafer 30 is set. Epitaxialwafer 30 has an LED structure, and hence the warp h is set to not more than 100 μm, for example.

Further, the radius r of GaN substrate 31 is obtained. This radius r can be obtained by measuring the radius of an underlayer substrate employed for an ingot as described above, for example.

The set values of the thickness t2 and the Al composition x of the $Al_xGa_{(1-x)}N$ layer and the warp h and the radius r of epitaxialwafer 30 are substituted in the expression 1, thereby finding the minimum thickness t1 of GaN substrate 31.

Then, GaN substrate 31 having a thickness of at least the minimum thickness and less than 400 μm is cut out from an ingot of GaN (step S2). If GaN substrate 31 having the minimum thickness t1 found from the expression 1 is hard to handle, the thickness of GaN substrate 31 is changed to that of not more than 400 μm allowing easy handling. If GaN substrate 31 is employed for epitaxialwafer 30 having the LED structure, the thickness of GaN substrate 31 is preferably set to at least the minimum thickness and less than 250 μm. GaN substrate 31 is thus cut out from the ingot with the decided thickness.

Then, buffer layer 32 is formed on the c-plane of GaN substrate 31. Then, active layer 33 is formed on buffer layer 32. Then, electron blocking layer 34 is formed on active layer 33. Then, contact layer 35 is formed on electron blocking layer 34. These epitaxial layers can be unrestrictedly formed by HVPE or MOCVD, for example.

Epitaxialwafer 30 shown in FIG. 3 is manufactured by carrying out the aforementioned steps. In order to manufacture LED 40, the following step (S4) is further carried out:

Electrode 41 is formed on a surface of GaN substrate 31 opposite to that provided with buffer layer 32. Further, electrode 42 is formed on contact layer 35. The method of forming electrodes 41 and 42 is not particularly restricted. Masks are formed on the surface and the back surface of epitaxialwafer 30 by photolithography, for example, metal layers for preparing electrodes 41 and 42 are formed by vapor deposition, for example, and electrodes 41 and 42 are formed by lift-off, for example.

LED 40 shown in FIG. 4 is manufactured by carrying out the aforementioned steps.

The remaining structure of the second embodiment is similar to that of the aforementioned first embodiment, and hence redundant description is not repeated.

EXAMPLE

Example of the present invention is now described. In this Example, the relation between the thickness t1 of GaN substrate 10 and the warp h of epitaxialwafer 20 was examined in order to find out the expression 1 for deciding the minimum thickness of GaN substrate 10 employed for epitaxialwafer 20 having at least three layers, i.e., GaN substrate 10, $Al_xGa_{(1-x)}N$ layer 21 formed on the c-plane of GaN substrate 10 and GaN layer 22 formed on $Al_xGa_{(1-x)}N$ layer 21, as shown in FIG. 1.

FIG. 6 is a schematic sectional view showing an epitaxialwafer 100 consisting of a GaN substrate 10 and an $Al_xGa_{(1-x)}N$ layer 21 formed on GaN substrate 10. In epitaxialwafer 100 having a two-layer structure consisting of GaN substrate 10 and $Al_xGa_{(1-x)}N$ layer 21 formed on the c-plane of GaN substrate 10 as shown in FIG. 6, the lattice constants of GaN and $Al_xGa_{(1-x)}N$ are different from each other, and hence it is known that epitaxialwafer 100 of the two-layer structure is strained. More specifically, the lattice constant of $Al_xGa_{(1-x)}N$ is smaller than that of GaN, and hence tensile stress is applied to the side of $Al_xGa_{(1-x)}N$ layer 21 while compressive stress is applied to the side of GaN substrate 10. Consequently, epitaxialwafer 100 has a downwardly convexed warp, as shown in FIG. 6. The relation between the thickness of GaN substrate 10 and the warp of epitaxialwafer 100 having the two-layer structure is now described with reference to FIG. 6. It is assumed that $Al_xGa_{(1-x)}N$ layer 21 is coherently grown on GaN substrate 10 with a thickness allowing no lattice relaxation.

Assuming that P represents the stress applied to GaN substrate 10 and $Al_xGa_{(1-x)}N$ layer 21, b represents the depth of GaN substrate 10 and $Al_xGa_{(1-x)}N$ layer 21, t1 represents the thickness of GaN substrate 10, M1 represents the bending moment of GaN substrate 10, E1 represents the Young's modulus of GaN substrate 10, r represents the radius of GaN substrate 10, I1 $(=b \times t1^3/12)$ represents the second moment of area of GaN substrate 10, t2 represents the thickness of $Al_xGa_{(1-x)}N$ layer 21, E2 represents the Young's modulus of $Al_xGa_{(1-x)}N$ layer 21, I2 $(=b \times t2^3/12)$ represents the bending moment of $Al_xGa_{(1-x)}N$ layer 21, M represents the bending moment of epitaxialwafer 100 and h represents the warp of epitaxialwafer 100, the relations between these values are expressed as follows:

$$M = M1 + M2 = P \times (t1+t2)/2 \quad \text{(expression 2)}$$

$$M1 = t1 \times I1/\rho = E1 \times b \times t1^3/(12 \times \rho) \quad \text{(expression 3)}$$

$$M = t2 \times I2/\rho = E2 \times b \times t2^3/(12 \times \rho) \quad \text{(expression 4)}$$

The following expression 5 results from the above expressions 2 to 4:

$$b \times (E1 \times t1^3 + E2 \times t2^3)/(12 \times \rho) = P \times (t1+t2)/2 \quad \text{(expression 5)}$$

The following expression 6 results from the expression 5:

$$P = b \times (E1 \times t1^3 + E2 \times t2^3)/\{6 \times \rho \times (t1+t2)\} \quad \text{(expression 6)}$$

Assuming that Δ represents the degree of lattice mismatching and k represents a proportionality factor, lattice mismatching strains of GaN substrate 10 and $Al_xGa_{(1-x)}N$ layer 21 are expressed as $k \times \Delta$ and $-k \times \Delta$ respectively. Strains of GaN substrate 10 and $Al_xGa_{(1-x)}N$ layer 21 resulting from axial force are expressed as $P/(E2 \times b \times t2)$ and $-P/(E1 \times b \times t1)$ respectively. Further, strains of GaN substrate 10 and $Al_xGa_{(1-x)}N$ layer 21 resulting from bending are expressed as $t2/(2 \times \rho)$ and $-t1/(2 \times \rho)$ respectively. Assuming that a1 and a2 represent the lattice constants of GaN and AlN respectively, the degree of lattice mismatching $(\Delta = -\Delta)$ is expressed as $x \times (a2/a1-1)$.

Strains of GaN substrate 10 and $Al_xGa_{(1-x)}N$ layer 21 on the interface must match with each other, and hence the following expression 7 results from the above relations and the above expression 6:

$$k \times \Delta + P/(E2 \times b \times t2) + t2/(2 \times \rho) = -k \times \Delta - P/(E1 \times b \times t1) - t1/(2 \times \rho) \quad \text{(expression 7)}$$

The following expression 8 results from the expression 7:

$$\rho = -(E1 \times t1^3 + E2 \times t2^3) \times \{1/(E1 \times t1) + 1/(E2 \times t2)\}/\{12 k \times \Delta \times (t1+t2)\} - (t1+t2)/(4k \times \Delta) \quad \text{(expression 8)}$$

Assuming that θ represents ½ of an angle at which virtual lines obtained by extending lines along respective side surfaces including ends of a certain diameter intersect with each other in the c-plane of epitaxialwafer 100, ρ represents the length of the virtual lines and h represents the warp of epitaxialwafer 100 as shown in FIG. 6, the following relations hold:

$$h = \rho - \rho \times \cos\theta \quad \text{(expression 9)}$$

$$r = \rho \times \sin\theta \quad \text{(expression 10)}$$

When the expressions 9 and 10 are substituted in $\sin^2\theta + \cos^2\theta = 1$, the following expression 11 holds:

$$(r/\rho)^2 + (1-h/\rho)^2 = 1 \quad \text{(expression 11)}$$

Thus, the relation between the thickness t1 of GaN substrate 10 and the warp h of epitaxialwafer 100 having the two-layer structure is shown in the expressions 8 and 11.

Figure 7:
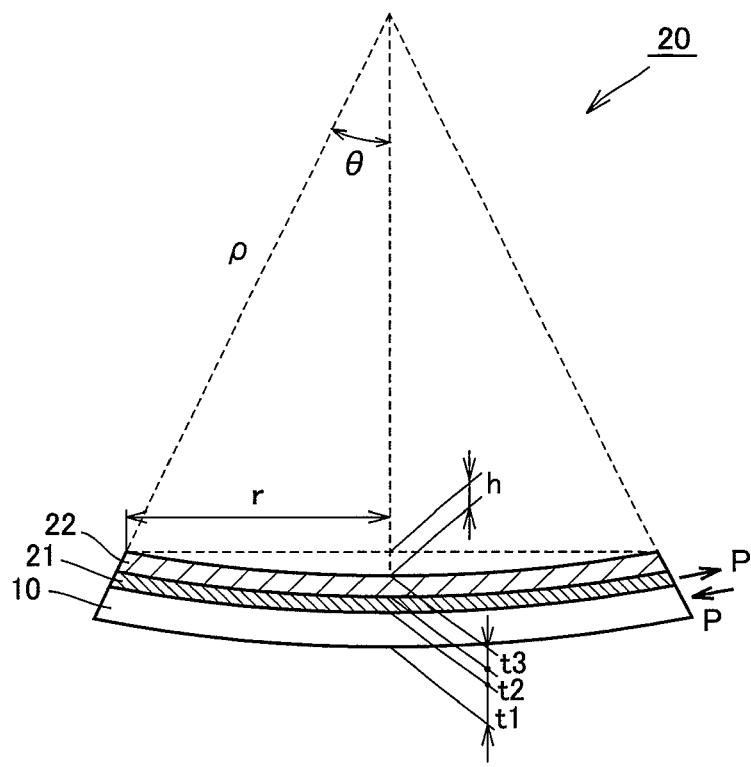
FIG. 7 is a schematic sectional view showing a warped state of an epitaxialwafer having three layers.

Then, the inventors have examined the relation between the thickness of GaN substrate 10 employed for epitaxialwafer 20 having at least three layers including GaN substrate 10 having the c-plane, $Al_xGa_{(1-x)}N$ layer 21, formed on the c-plane of GaN substrate 10, having the Al composition x of over zero and not more than 0.3 and the thickness of over zero and not more than 30 nm and GaN layer 22 formed on $A_xGa_{(1-x)}N$ layer 21 as shown in FIGS. 1 and 7 as follows: FIG. 7 is a schematic sectional view showing a warped state of epitaxialwafer 20 having three layers. In other words, FIG. 7 shows a warped state of epitaxialwafer 20 shown in FIG. 1.

First, the layer (GaN layer 22 in FIGS. 1 and 7) formed on $Al_xGa_{(1-x)}N$ layer 21 has an extremely small thickness as compared with GaN substrate 10 in epitaxialwafer 20 having at least three layers, and hence the inventors have considered correcting the expression 8 applied to epitaxialwafer 100 having the two-layer structure and applying the corrected expression to epitaxialwafer 20 having at least three layers.

Second, GaN layer 22 is formed on $Al_xGa_{(1-x)}N$ layer 21 in epitaxialwafer 20 having at least three layers, and hence $Al_xGa_{(1-x)}N$ layer 21 is strained due to GaN substrate 10 and GaN layer 22 respectively. In epitaxialwafer 100 having the two-layer structure, on the other hand, only one surface is strained. Therefore, the inventors have considered that the Young's modulus E2 of $Al_xGa_{(1-x)}N$ layer 21 in the expression 8 applied to epitaxialwafer 100 having the two-layer structure cannot be applied to epitaxialwafer 20 having at least three layers. Hence, the inventors have considered substituting another constant E for the Young's modulus E2 in the expression 8.

Third, the proportionality factor k in the expression 8 is proportionate to the difference between the lattice constants of GaN and $Al_xGa_{(1-x)}N$ on the interface between GaN substrate 10 and $Al_xGa_{(1-x)}N$ layer 21. Therefore, the inventors have considered that the proportionality factor k set only in consideration of the difference between the lattice constants of GaN and $Al_xGa_{(1-x)}N$ cannot be applied to epitaxialwafer 20 having at least three layers if GaN layer 22 is formed on $Al_xGa_{(1-x)}N$ layer 21 in epitaxialwafer 20 having at least three layers. Thus, the inventors have considered substituting another constant K for the proportionality factor k in the expression 8.

As hereinabove described, the constants E and K were substituted for the Young's modulus E2 and the proportionality factor k in the above expression 8 respectively, to assume the following expression 12:

$$\rho = -(E1 \times t1^3 E \times t2^3) \times \{1/(E1 \times t1) \times 1/(E \times t2)\}/\{12K \times \Delta \times (t1+t2)\} - (t1+t2)/(4K \times \Delta) \quad \text{(expression 12)}$$

In this Example, the Al composition x and the thickness of $Al_xGa_{(1-x)}N$ layer 21 were set to over zero and not more than 0.3 and over zero and not more than 30 nm respectively. In epitaxialwafer 100 having the two-layer structure, E2 and k are constants depending on the Al composition x of $Al_xGa_{(1-x)}N$ layer 21. If the Al composition x is over zero and not more than 1 and the thickness is unlimited in $Al_xGa_{(1-x)}N$ layer 21 of epitaxialwafer 20, fluctuation ranges of the constants E and K are increased. In order to regard the fluctuation ranges of the constants E and K as substantially identical to each other, the Al composition x and the thickness were set to over zero and not more than 0.3 and over zero and not more than 30 nm respectively in $Al_xGa_{(1-x)}N$ layer 21 of epitaxialwafer 20 in this Example.

Then, the inventors have manufactured seven samples 1 to 7 of epitaxialwafer 30 constituting LED 40 shown in FIG. 4 and measured the relation between the thickness of GaN substrate 10 and the warp of epitaxialwafer 30 in each sample, in order to decide the values of the constants E and K in the expression 12.

More specifically, GaN substrate 31 having a thickness t31 of 350 μm and a radius r of 25 mm was prepared for the sample 1 of epitaxialwafer 30 having the LED structure shown in FIG. 3. Thereafter buffer layer 32 of n-type GaN having a thickness t32 of 2.0 μm was formed on GaN substrate 31 by MOCVD. Then, active layer 33 having a 3 QW (quantum well) structure of InGaN/GaN with a thickness t33 of 0.05 μm was formed on buffer layer 32 by MOCVD. Then, electron blocking layer 34 of $Al_{0.18}Ga_{0.82}N$ having a thickness t34 of 0.02 μm was formed on active layer 33 by MOCVD. Then, contact layer 35 of p-type GaN having a thickness t35 of 0.2 μm was formed on electron blocking layer 34 by MOCVD. Thus, the sample 1 of epitaxialwafer 30 was manufactured.

The sample 2 of epitaxialwafer 30 was basically similar in structure to the sample 1, except that the thickness t31 of GaN substrate 31 was set to 250 μm.

The sample 3 of epitaxialwafer 30 was basically similar in structure to the sample 1, except that the thickness t31 of GaN substrate 31 was set to 200 μm.

The sample 4 of epitaxialwafer 30 was basically similar in structure to the sample 1, except that the Al composition x and the thickness of the $Al_xGa_{(1-x)}N$ layer were set to 0.30 and 0.03 μm respectively.

The sample 5 of epitaxialwafer 30 was basically similar in structure to the sample 1, except that the Al composition x and the thickness of the $Al_xGa_{(1-x)}N$ layer were set to 0.30 and 0.03 μm respectively and the thickness t31 of GaN substrate 31 was set to 250 μm.

The sample 6 of epitaxialwafer 30 was basically similar in structure to the sample 1, except that the Al composition x and the thickness of the $Al_xGa_{(1-x)}N$ layer were set to 0.30 and 0.03 μm respectively and the thickness t31 of GaN substrate 31 was set to 200 μm.

The sample 7 of epitaxialwafer 30 was basically similar in structure to the sample 1, except that the Al composition x and the thickness of the $Al_xGa_{(1-x)}N$ layer were set to 0.30 and 0.03 μm respectively and the thickness t31 of GaN substrate 31 was set to 150 μm.

Figure 8:
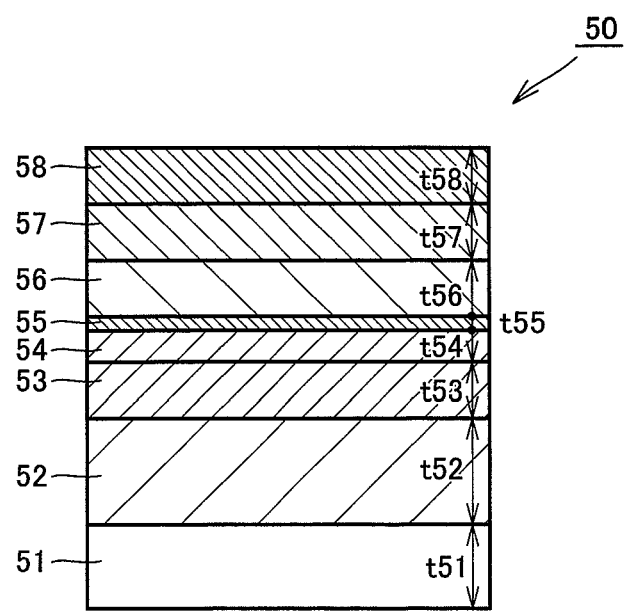
FIG. 8 is a schematic sectional view showing each of samples 8 and 9 of epitaxialwafers.

Further, additional samples 8 and 9 of epitaxialwafers out of the scope of the present invention were prepared. FIG. 8 is a schematic sectional view showing each of the samples 8 and 9 of epitaxialwafers. More specifically, a GaN substrate 51 having a thickness t51 of 400 μm and a radius of 25 mm was prepared. Thereafter an n-type $Al_{0.05}Ga_{0.95}N$ layer 52 having a thickness t52 of 2 μm, a GaN layer 53 having a thickness t53 of 0.2 μm, a 3 QW layer 54 of InGaN/GaN having a thickness t54 of 0.05 μm, a p-type $Al_{0.18}Ga_{0.82}N$ layer 55 having a thickness t55 of 0.02 μm, a GaN layer 56 having a thickness t56 of 0.2 μm, an $Al_{0.05}Ga_{0.95}N$ layer 57 having a thickness t57 of 0.4 μm and a GaN layer 58 having a thickness t58 of 0.2 μm were successively formed on GaN substrate 51 by MOCVD.

In each of the samples 1 to 9 of epitaxialwafers obtained in the aforementioned manner, warps were measured as to five diameters, and the average of the five warps was regarded as the warp of each of the samples 1 to 9 of epitaxialwafers. Table 1 shows the results.

TABLE 1

| Epitaxialwafer | Conditions | Thickness of GaN Substrate t1(μm) | Warp of Epitaxialwafer h(μm) |
|---|---|---|---|
| Sample 1 | x = 0.18, t2 = 0.02 μm | 350 | 3 |
| Sample 2 | | 250 | 6 |
| Sample 3 | | 200 | 10 |
| Sample 4 | x = 0.30, t2 = 0.03 μm | 350 | 6 |
| Sample 5 | | 250 | 10 |
| Sample 6 | | 200 | 16 |
| Sample 7 | | 150 | 30 |
| Sample 8 | x = 0.05, t2 = 2.4 μm | 400 | 30 |
| Sample 9 | | 400 | 45 |

As to each of the samples 1 to 7, the thickness t1 of GaN substrate 10 was so set as to satisfy the warp h of epitaxialwafer 30, and the constants E and K were obtained by least squares approximation. Consequently, it has been found that the constants E and K are equal to $1.2 \times 10^{11}$ and 1.33 respectively.

In each of the expressions 8 and 12, the Young's modulus E1 was set to that of GaN, i.e., $1.5 \times 10^{11}$ (GPa).

Therefore, substitution of the above values E, K and E1 in the expression 12 results in the following expression 13:

$$\rho = -(1.5 \times 10^{11} \times t1^3 + 1.2 \times 10^{11} \times t2^3) \times \{1/(1.5 \times 10^{11} \times t1) + 1/(1.2 \times 10^{11} \times t2)\}/\{12 \times 1.33 \times \Delta \times (t1+t2)\} - (t1+t2)/(4 \times 1.33 \times \Delta) \quad \text{(expression 13)}$$

The expression $\rho = (x^2 + h^2)/2h$ derived from the expression 11 and the degree of lattice mismatching $\Delta = -\Delta = x \times (a2/a1 - 1)$ are substituted in the expression 13, to derive the following expression 1:

$$(1.5 \times 10^{11} \times t1^3 + 1.2 \times 10^{11} \times t2^3) \times \{1/(1.5 \times 10^{11} \times t1) + 1/(1.2 \times 10^{11} \times t2)\}/\{15.96 \times x \times (1-a2/a1)\} \times (t1+t2) + (t1 \times t2)/\{5.32 \times x \times (1-a2/a1)\} - (r^2+h^2)/2h = 0 \quad \text{(expression 1)}$$

Figure 9:
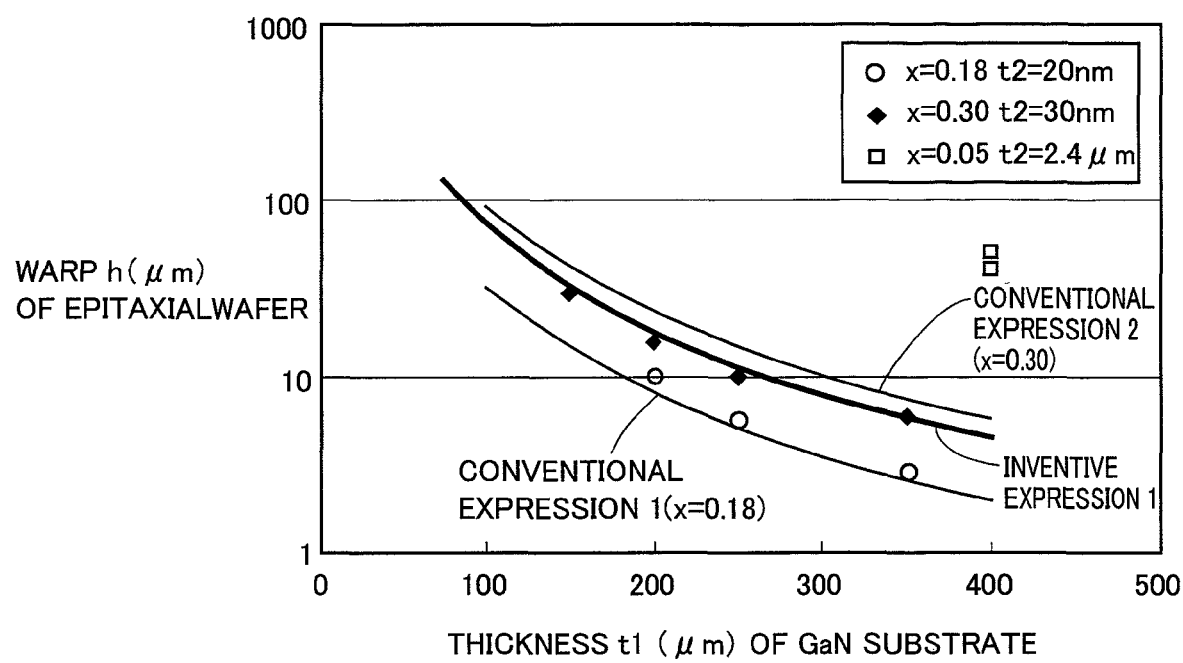
FIG. 9 shows the relations between thicknesses t1 of GaN substrates and warps h of epitaxialwafers as to the expression 1 according to the present invention, expressions as to an epitaxialwafer having two layers and samples 1 to 9.

The expression 1 related to the epitaxialwafer having at least three layers according to the present invention and the expressions 8 and 11 related to epitaxialwafer 100 having the two-layer structure are compared with each other with reference to FIG. 9.

FIG. 9 shows the relations between the thicknesses t1 of GaN substrates and warps h of epitaxialwafers as to the expression 1 according to the present invention, expressions derived from the expressions 8 and 11 related to epitaxialwafer 100 having the two-layer structure and the samples 1 to 9. Referring to FIG. 9, "inventive expression 1" denotes the warps h (m) of epitaxialwafers with the Al composition x of 0.18 in the above expression 1. "Conventional expression 1" denotes the warps h of epitaxialwafers with the Al composition x of 0.18, the Young's modulus E2 of $Al_{0.18}Ga_{0.82}N$ of $1.78 \times 10^{11}$ (GPa) and the proportionality factor k of epitaxialwafer 100 having the two-layer structure of 1.00 in the above expressions 8 and 11. "Conventional expression 2" denotes the warps h of epitaxialwafers with the Al composition x of 0.30, the Young's modulus E2 of $Al_{0.30}Ga_{0.70}N$ of $1.97 \times 10^{11}$ (GPa) and the proportionality factor k of $Al_{0.30}Ga_{0.70}N$ of 1.00 in the above expressions 8 and 11. The Young's moduli E1 in the inventive expression 1 and the conventional expressions 1 and 2 were set to that of GaN, i.e., $1.5 \times 10^{11}$.

As understood from the inventive expression 1 in FIG. 9 and the samples 1 to 7, it has been recognized that epitaxialwafer 20 having $Al_xGa_{(1-x)}N$ layer 21 and GaN layer 22 formed thereon regularly satisfies the set warp h when the warp h, the thickness t2 and the Al composition x of prepared epitaxialwafer 20 are set in the inventive expression 1 and the thickness of GaN substrate 10 is set to at least the thickness calculated by obtaining the radius r thereof. It has also been recognized that the set warp h of epitaxialwafer 20 is satisfied, and the thickness of GaN substrate 10 for satisfying the set warp h of epitaxialwafer 20 is not excessively increased.

As understood from the inventive expression 1 in FIG. 9 and the samples 8 and 9, it has been recognized that application of the expression 1 is not proper as to an epitaxialwafer including an $Al_xGa_{(1-x)}N$ layer having a thickness out of the range of over zero and not more than 30 nm. As to an epitaxialwafer including an $Al_xGa_{(1-x)}N$ layer having an Al composition x of over zero and not more than 0.3 and a thickness of over zero and not more than 3 nm, it has been recognized that the above expression 1 is so found as to satisfy x=0.30 and t2=30 nm in the case where the warp h is maximized in epitaxialwafer 20 including $Al_xGa_{(1-x)}N$ layer 21 having the Al composition x and the thickness in these ranges, and hence it has been recognized that the above expression 1 can be applied to epitaxialwafer 20 having $Al_xGa_{(1-x)}N$ layer 21 of the aforementioned structure.

Therefore, it has been recognized that the expression 1 found by assuming the expression 12 and examining the constants E and K is applicable to epitaxialwafer 20 having at least three layers in the aforementioned structure.

On the other hand, the thickness t1 (200 μm, for example) of the GaN substrate in the case of setting the warp h (6 μm, for example) of the epitaxialwafer in the expression (conventional expression 1 in FIG. 9) for epitaxialwafer 100 having the two-layer structure with the Al composition x of 0.18 was smaller than the thickness (250 μm, for example) of GaN substrate 31 according to each of the samples 1 and 2 with the Al composition x of 0.18 satisfying the same warp h (6 μm, for example) of epitaxialwafer 30. In other words, epitaxialwafer 100 prepared by setting the warp h, the thickness t2 and the Al composition x thereof in the expression for epitaxialwafer 100 having the two-layer structure with the Al composition x of 0.18, manufacturing GaN substrate 10 with the thickness found by substituting the Young's modulus of $Al_xGa_{(1-x)}N$ in the expression and forming $Al_xGa_{(1-x)}N$ layer 21 and GaN layer 22 thereon did not satisfy the set warp h of epitaxialwafer 100. Therefore, epitaxialwafer 100 manufactured with GaN substrate 10 having the thickness found through the expression for epitaxialwafer 100 having the two-layer structure may not satisfy the performance of the warp h, and hence it has been recognized that the conventional expression 1 cannot be applied to epitaxialwafer 20 having at least three layers including GaN substrate 10, $Al_xGa_{(1-x)}N$ layer 21 and GaN layer 22.

In the expression (conventional expression 2 in FIG. 9) for epitaxialwafer 100 having the two-layer structure with the Al composition x of 0.30, the thickness t1 of GaN substrate 10 in the case of setting the warp h of epitaxialwafer 100 in the expression for epitaxialwafer 100 having the two-layer structure was larger than that of GaN substrate 10 according to each of the samples 4 to 7 satisfying the same warp h of epitaxialwafer 20 with the Al composition x of 0.30. In other words, the thickness of epitaxialwafer 100 prepared by setting the warp h, the thickness t2 and the Al composition x thereof in the expression for epitaxialwafer 100 having the two-layer structure with the Al composition x of 0.30, manufacturing GaN substrate 10 with the thickness found by substituting the Young's modulus of $Al_xGa_{(1-x)}N$ in the expression and forming $Al_xGa_{(1-x)}N$ layer 21 and GaN layer 22 thereon was larger than the thickness t1 of GaN substrate 10 obtained through the inventive expression 1. Thus, it has been recognized that the thickness t1 of GaN substrate 10 found through the expression for epitaxialwafer 100 having the two-layer structure with the Al composition x of 0.30 is not optimum for satisfying the set warp h of epitaxialwafer 20.

According to this Example, as hereinabove described, the expression for finding the minimum thickness of GaN substrate 10 for satisfying the warp h of epitaxialwafer 20 having at least three layers was found out. Further, it was possible to confirm that the minimum thickness satisfying the set warp h of epitaxialwafer 20 can be decided according to the expression 1.

Although the present invention has been described and illustrated in detail, it is clearly understood that the same is by way of illustration and example only and is not to be taken by way of limitation, the scope of the present invention being interpreted by the terms of the appended claims.

The present invention is particularly advantageously applicable to a method of manufacturing a GaN substrate having a c-plane for manufacturing an epitaxialwafer by successively stacking an $Al_xGa_{(1-x)}N$ layer and a GaN layer on the c-plane.

What is claimed is:

1. A method of manufacturing a GaN substrate having a c-plane for manufacturing an epitaxialwafer by successively stacking at least two layers including an $Al_xGa_{(1-x)}N$ layer having an Al composition x greater than zero and not more than 0.3 and a thickness greater than zero and not more than 30 nm and a GaN layer on said c-plane, comprising the steps of:

deciding a value t1 found by the following expression 1 as the minimum thickness of said GaN substrate:

$$(1.5 \times 10^{11} \times t1(m)^3 + 1.2 \times 10^{11} \times t2(m)^3) \times \{1/(1.5 \times 10^{11} \times t1(m)) + 1/(1.2 \times 10^{11} \times t2(m))\}/\{15.96 \times x \times (1 - a2/a1)\} \times (t1(m) + t2(m)) + (t1(m) \times t2(m))/\{5.32 \times x \times (1 - a2/a1)\} - (r(m)^2 + h(m)^2)/2h(m) = 0 \quad \text{(expression 1)}$$

where t1(m) represents the thickness of said GaN substrate, r(m) represents the radius of said GaN substrate, t2(m) represents the thickness of said $Al_xGa_{(1-x)}N$ layer, x represents the Al composition in said $Al_xGa_{(1-x)}N$ layer, h(m) represents a warp of said epitaxialwafer, a1 represents the lattice constant of GaN and a2 represents the lattice constant of AlN; and cutting out said GaN substrate having a thickness of at least said minimum thickness and less than 400 μm from an ingot of GaN.

2. The method of manufacturing a GaN substrate according to claim 1, forming said GaN substrate having a thickness, at least said minimum thickness, of at least 100 μm and less than 250 μm in said step of cutting out said GaN substrate.

3. A method of manufacturing an epitaxialwafer, comprising the steps of:

manufacturing a GaN substrate by the method of manufacturing a GaN substrate according to claim 1;

forming an $Al_xGa_{(1-x)}N$ layer on said c-plane of said GaN substrate; and forming a GaN layer on said $Al_xGa_{(1-x)}N$ layer.

4. A method of manufacturing a semiconductor device, comprising the steps of:

manufacturing an epitaxialwafer by the method of manufacturing an epitaxialwafer according to claim 3; and forming an electrode on said epitaxialwafer.

* * * * *